United States Patent
Hartman et al.

(10) Patent No.: US 9,439,269 B2
(45) Date of Patent: Sep. 6, 2016

(54) POWERLINE LUMINAIRE COMMUNICATIONS

(71) Applicant: GENERAL ELECTRIC COMPANY, Schenectady, NY (US)

(72) Inventors: Michael James Hartman, Clifton Park, NY (US); Bruce Gordon Barnett, Niskayuna, NY (US); John Erik Hershey, Ballston, NY (US); Michael Joseph Dell'Anno, Niskayuna, NY (US); Stanislava Soro, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 3 days.

(21) Appl. No.: 14/546,856

(22) Filed: Nov. 18, 2014

(65) Prior Publication Data

US 2015/0137703 A1    May 21, 2015

Related U.S. Application Data (60) Provisional application No. 61/907,090, filed on Nov. 21, 2013, provisional application No. 61/907,078, filed on Nov. 21, 2013, provisional application No. 61/907,069, filed on Nov. 21, 2013, provisional (Continued)

(51) Int. Cl.
*H05B 37/02* (2006.01)
*G08G 1/087* (2006.01)
*H04W 4/04* (2009.01)
*G01R 22/06* (2006.01)

(Continued)

(52) U.S. Cl.
CPC .......... *H05B 37/0227* (2013.01); *G01P 15/18* (2013.01); *G01R 22/06* (2013.01); *G08B 21/18* (2013.01); *G08G 1/087* (2013.01); *H04W 4/046* (2013.01); *H05B 37/0263* (2013.01); *H05B 37/0272* (2013.01); *Y02B 20/72* (2013.01)

(58) Field of Classification Search
CPC ................... H05B 33/0263–33/0272
USPC ............... 315/291, 294, 297, 307, 308, 312
See application file for complete search history.

(56) References Cited

U.S. PATENT DOCUMENTS 4,704,610 A    11/1987  Smith et al.
5,014,052 A    5/1991   Obeck (Continued)

FOREIGN PATENT DOCUMENTS

EP    1437270 A1    7/2004
EP    2131630 A2    12/2009

(Continued)

OTHER PUBLICATIONS

U.S. Appl. No. 14/543,892, filed Nov. 18, 2014, Hershey et al.

(Continued)

*Primary Examiner* — Douglas W Owens
*Assistant Examiner* — Jonathan Cooper
(74) *Attorney, Agent, or Firm* — Mary Louise Stanford (57) ABSTRACT

A system and method for a lighting control system to control street lighting fixtures using modified geometric harmonic modulation for communications over a powerline. At least some of the lighting fixtures have another communications capability that enables RF communications. The communications may by messages be sent to the lighting fixtures to read RF enabled meters.

19 Claims, 4 Drawing Sheets

Related U.S. Application Data application No. 61/907,114, filed on Nov. 21, 2013, provisional application No. 61/907,133, filed on Nov. 21, 2013, provisional application No. 61/907,150, filed on Nov. 21, 2013, provisional application No. 61/907,168, filed on Nov. 21, 2013, provisional application No. 61/907,188, filed on Nov. 21, 2013, provisional application No. 61/907,210, filed on Nov. 21, 2013.

(51) Int. Cl.
*G01P 15/18* (2013.01)
*G08B 21/18* (2006.01)

(56) References Cited

U.S. PATENT DOCUMENTS

| | | | |
|---|---|---|---|
| 5,199,044 A | 3/1993 | Takeuchi et al. | |
| 5,243,185 A | 9/1993 | Blackwood | |
| 5,345,232 A | 9/1994 | Robertson | |
| 5,519,692 A | 5/1996 | Hershey et al. | |
| 5,519,725 A | 5/1996 | Hershey et al. | |
| 5,526,357 A | 6/1996 | Jandrell | |
| 5,563,906 A | 10/1996 | Hershey et al. | |
| 5,568,507 A | 10/1996 | Hershey et al. | |
| 5,568,508 A | 10/1996 | Hershey | |
| 5,568,509 A | 10/1996 | Hershey et al. | |
| 5,568,522 A | 10/1996 | Hershey et al. | |
| 5,682,100 A | 10/1997 | Rossi et al. | |
| 5,761,238 A | 6/1998 | Ross et al. | |
| 5,844,949 A | 12/1998 | Hershey et al. | |
| 5,852,243 A | 12/1998 | Chang et al. | |
| 5,903,594 A | 5/1999 | Saulnier et al. | |
| 6,011,508 A | 1/2000 | Perreault et al. | |
| 6,101,214 A | 8/2000 | Hershey et al. | |
| 6,288,632 B1 | 9/2001 | Hoctor et al. | |
| 6,346,875 B1 | 2/2002 | Puckette et al. | |
| 6,424,250 B1* | 7/2002 | Puckette, IV | H04B 3/54 340/12.33 |
| 6,430,210 B1 | 8/2002 | McGrath et al. | |
| 6,459,998 B1 | 10/2002 | Hoffman | |
| 6,522,243 B1* | 2/2003 | Saulnier | H04B 3/542 307/105 |
| 6,717,660 B1 | 4/2004 | Bernardo | |
| 6,943,668 B2 | 9/2005 | Gaus, Jr. et al. | |
| 7,175,082 B2 | 2/2007 | Hoshina | |
| 7,248,149 B2 | 7/2007 | Bachelder et al. | |
| 7,294,977 B1 | 11/2007 | Eusterbrock et al. | |
| 7,418,346 B2 | 8/2008 | Breed et al. | |
| 7,460,787 B2 | 12/2008 | Damink et al. | |
| 7,580,705 B2 | 8/2009 | Kumar | |
| 7,629,899 B2 | 12/2009 | Breed | |
| 7,646,330 B2 | 1/2010 | Karr | |
| 7,817,063 B2 | 10/2010 | Hawkins et al. | |
| 7,834,555 B2 | 11/2010 | Cleland et al. | |
| 7,855,376 B2 | 12/2010 | Cantin et al. | |
| 7,876,864 B2 | 1/2011 | Conrad et al. | |
| 7,899,621 B2 | 3/2011 | Breed et al. | |
| 7,912,645 B2 | 3/2011 | Breed et al. | |
| 7,983,685 B2 | 7/2011 | Silverstrim et al. | |
| 7,983,836 B2 | 7/2011 | Breed | |
| 8,138,690 B2 | 3/2012 | Chemel et al. | |
| 8,140,276 B2 | 3/2012 | Walters et al. | |
| 8,227,995 B2 | 7/2012 | Damink et al. | |
| 8,232,745 B2 | 7/2012 | Chemel et al. | |
| 8,244,260 B2 | 8/2012 | Silverstrim et al. | |
| 8,260,537 B2 | 9/2012 | Breed | |
| 8,274,373 B2 | 9/2012 | Nysen | |
| 8,339,069 B2 | 12/2012 | Chemel et al. | |
| 8,368,321 B2 | 2/2013 | Chemel et al. | |
| 8,373,362 B2 | 2/2013 | Chemel et al. | |
| 8,384,312 B2 | 2/2013 | Tsai | |
| 8,436,748 B2 | 5/2013 | Mimeault et al. | |
| 8,441,214 B2 | 5/2013 | Anderson | |
| 8,442,403 B2 | 5/2013 | Weaver | |
| 8,442,785 B2 | 5/2013 | Walters et al. | |
| 8,456,325 B1 | 6/2013 | Sikora | |
| 2005/0187701 A1 | 8/2005 | Baney | |
| 2007/0201540 A1 | 8/2007 | Berkman | |
| 2007/0229250 A1 | 10/2007 | Recker et al. | |
| 2008/0037241 A1 | 2/2008 | Von Der Brelie | |
| 2008/0122642 A1 | 5/2008 | Radtke et al. | |
| 2008/0150757 A1 | 6/2008 | Hutchison | |
| 2008/0238720 A1 | 10/2008 | Lee | |
| 2009/0002982 A1 | 1/2009 | Hu et al. | |
| 2009/0034258 A1 | 2/2009 | Tsai et al. | |
| 2009/0066540 A1 | 3/2009 | Marinakis et al. | |
| 2009/0164174 A1 | 6/2009 | Bears et al. | |
| 2009/0297156 A1 | 12/2009 | Nakagawa et al. | |
| 2010/0115093 A1 | 5/2010 | Rice | |
| 2010/0295473 A1 | 11/2010 | Chemel et al. | |
| 2010/0295474 A1 | 11/2010 | Chemel et al. | |
| 2010/0295475 A1 | 11/2010 | Chemel et al. | |
| 2010/0295482 A1 | 11/2010 | Chemel et al. | |
| 2010/0295943 A1 | 11/2010 | Cha et al. | |
| 2010/0296285 A1 | 11/2010 | Chemel et al. | |
| 2010/0301768 A1 | 12/2010 | Chemel et al. | |
| 2010/0301770 A1 | 12/2010 | Chemel et al. | |
| 2010/0301771 A1 | 12/2010 | Chemel et al. | |
| 2010/0301773 A1 | 12/2010 | Chemel et al. | |
| 2010/0301774 A1 | 12/2010 | Chemel et al. | |
| 2010/0301834 A1 | 12/2010 | Chemel et al. | |
| 2010/0302779 A1 | 12/2010 | Chemel et al. | |
| 2011/0001436 A1 | 1/2011 | Chemel et al. | |
| 2011/0001438 A1 | 1/2011 | Chemel et al. | |
| 2011/0001626 A1 | 1/2011 | Yip et al. | |
| 2011/0043035 A1 | 2/2011 | Yamada et al. | |
| 2011/0069960 A1 | 3/2011 | Knapp et al. | |
| 2011/0095867 A1 | 4/2011 | Ahmad | |
| 2011/0115384 A1 | 5/2011 | Chatelus | |
| 2011/0140950 A1 | 6/2011 | Andersson | |
| 2011/0215736 A1 | 9/2011 | Horbst et al. | |
| 2011/0227584 A1 | 9/2011 | Beck | |
| 2011/0288658 A1 | 11/2011 | Walters et al. | |
| 2012/0062123 A1 | 3/2012 | Jarrell et al. | |
| 2012/0086560 A1* | 4/2012 | Ilyes | H05B 37/0227 340/12.5 |
| 2012/0086561 A1 | 4/2012 | Ilyes et al. | |
| 2012/0126721 A1 | 5/2012 | Kuenzler et al. | |
| 2012/0136485 A1 | 5/2012 | Weber et al. | |
| 2012/0140748 A1 | 6/2012 | Carruthers | |
| 2012/0154239 A1 | 6/2012 | Bar-Sade et al. | |
| 2012/0163826 A1 | 6/2012 | Schenk et al. | |
| 2012/0209505 A1 | 8/2012 | Breed et al. | |
| 2012/0218101 A1 | 8/2012 | Ford | |
| 2012/0230696 A1* | 9/2012 | Pederson | G07C 9/00158 398/115 |
| 2012/0245880 A1 | 9/2012 | Nabrotzky | |
| 2012/0256777 A1 | 10/2012 | Smith et al. | |
| 2012/0262304 A1 | 10/2012 | Cripps | |
| 2012/0286673 A1 | 11/2012 | Holland et al. | |
| 2012/0308239 A1 | 12/2012 | Sheth et al. | |
| 2012/0309293 A1 | 12/2012 | Kummetz et al. | |
| 2012/0321321 A1 | 12/2012 | Riesebosch | |
| 2012/0323474 A1 | 12/2012 | Breed et al. | |
| 2013/0044488 A1 | 2/2013 | Hreish | |
| 2013/0057158 A1 | 3/2013 | Josefowicz et al. | |
| 2013/0101003 A1 | 4/2013 | Vedantham et al. | |
| 2013/0140995 A1 | 6/2013 | Jones | |
| 2013/0169468 A1 | 7/2013 | Johnson et al. | |
| 2013/0172012 A1 | 7/2013 | Zudrell-Koch | |
| 2013/0181636 A1 | 7/2013 | Agrawal | |
| 2013/0214697 A1 | 8/2013 | Archenhold | |
| 2013/0229116 A1 | 9/2013 | Van Zeijl et al. | |
| 2013/0257284 A1 | 10/2013 | VanWagoner et al. | |
| 2013/0293117 A1 | 11/2013 | Verfuerth | |

FOREIGN PATENT DOCUMENTS

| | | |
|---|---|---|
| EP | 2521426 A1 | 11/2012 |
| GB | 2403357 A | 12/2004 |
| JP | 2005248607 A | 9/2005 |
| JP | 2009025209 A | 2/2009 |
| JP | 2009103497 A | 5/2009 |

(56) References Cited

FOREIGN PATENT DOCUMENTS

| KR | 1020060008967 A | 1/2006 |
|---|---|---|
| KR | 1020060102552 A | 9/2006 |
| KR | 100986279 B1 | 10/2010 |
| WO | 2005029437 A2 | 3/2005 |
| WO | 2009148466 A1 | 12/2009 |
| WO | 2010079388 A1 | 7/2010 |
| WO | 2011142516 A1 | 11/2011 |
| WO | 2012090142 A2 | 7/2012 |
| WO | 2012140152 A1 | 10/2012 |
| WO | 2013160791 A2 | 10/2013 |

OTHER PUBLICATIONS

U.S. Appl. No. 14/546,982, filed Nov. 18, 2014, Hershey et al.
U.S. Appl. No. 14/546,954, filed Nov. 18, 2014, Hershey et al.
U.S. Appl. No. 14/484,300, filed Sep. 12, 2014, Hartman et al.
U.S. Appl. No. 14/546,486, filed Nov. 18, 2014, Hartman et al.
U.S. Appl. No. 14/546,408, filed Nov. 18, 2014, Hartman et al.
U.S. Appl. No. 14/546,256, filed Nov. 18, 2014, Barnett et al.
U.S. Appl. No. 14/546,916, filed Nov. 18, 2014, Hershey et al.
International Search Report and Written Opinion issued in connection with corresponding PCT Application No. PCT/US2014/066927 dated Feb. 27, 2015.
Atlas, "Optical Extinction by Rainfall", Journal of Meteorology, vol. No. 10, pp. 486-488, Dec. 1953.
Noe et al., "Global Positioning System, A Navigation Algorithm for the Low-Cost GPS Receiver", The Institute of Navigation, vol. No. 1, pp. 166-172, 1980.
Proakis, "Spread Spectrum Signals for Digital Communication," in Digital Communications, for an overview of DS theory, pp. 1-27, 1983.
Hershey et al., "Random and Pseudorandom Sequences," Data Transportation and Protection, pp. 259-310, 1986.
"Millimeter Wave Propagation: Spectrum Management Implications" published by the FCC as Bulletin No. 70, Jul. 1997.
Pang et al., "LED Traffic Light as a Communications Device", Proceedings of the International Conference on Intelligent Transportation Systems, pp. 788-793, 1999.
Mimbela et al., "A Summary of Vehicle Detection and Surveillance Technologies Used in Intelligent Transportation Systems", Southwest Technology Development Institute, pp. 1-211, Nov. 30, 2000.
Chao-Qun et al., "Application of Low-voltage Power Line Communication in a City Street Lamp Long-distance Intelligent Monitoring System", Research and Developments, 2006.
Cho et al., "Street Lighting Control Based on LonWorks Power Line Communication", Power Line Communications and Its Applications, pp. 396-398, Apr. 2008.
Awan et al., "Characterization of Fog and Snow Attenuations for Free-Space Optical Propagation", Journal of Communications, vol. No. 4, Issue No. 8, pp. 533-545, Sep. 2009.
Rich, "Light Monitoring System Keeps Glendale, Ariz., Out of the Dark", Government Technology, Oct. 24, 2011.
"Monitoring and Evaluation Protocol for the Field Performance of LED Street Lighting Technologies", Light Savers Accelerating Advanced Outdoor Lighting, Prepared by Toronto Atmospheric Fund in Partnership with Ontario Municipal Street Lighting Focus Group and Ontario Power Authority, pp. 1-32, 2011.
Qian et. al., "Based on PLC and GPRS, ZigBee street lamp wireless control system", Electronic Design Engineering, vol. No. 20, Issue No. 3, Feb. 2012.
Stevens et al., "White Paper—The Benefits of 60 GHz Unlicensed Wireless Communications" as captured by Wayback machine, SUB10 systems.com, pp. 1-10, May 7, 2012.
"Wireless Control and Communication System for LED Luminaires and Other Devices", San Francisco Public Utilities Commission Power Enterprise, pp. 1-15, Jun. 7, 2012.
Zotos et al., "Case study of a dimmable outdoor lighting system with intelligent management and remote control", Telecommunications and Multimedia (TEMU), 2012 International Conference on, pp. 43-48, Jul. 30-Aug. 1, 2012.
Caillet et al., "LonMark, the open Smart Streetlight Platform", Lonmark International, pp. 1-16, Feb. 2013.
After Newtown: A new use for a weapons-detecting radar?, University of Michigan, Apr. 1, 2013.
Lee et al., "Distributed dimming control for LED lighting", Optics Express, vol. No. 21, Issue No. S6, pp. 1-16, Nov. 2013.
International Search Report and Written Opinion issued in connection with corresponding PCT Application No. PCT/US2014/066954 dated Feb. 26, 2015.
International Search Report and Written Opinion issued in connection with related PCT Application No. PCT/US2014/066922 dated Feb. 26, 2015.
International Search Report and Written Opinion issued in connection with related PCT Application No. PCT/US2014/066957 dated Mar. 5, 2015.
International Search Report and Written Opinion issued in connection with related PCT Application No. PCT/US2014/066917 dated Mar. 5, 2015.
International Search Report and Written Opinion issued in connection with related PCT Application No. PCT/US2014/066337 dated Mar. 6, 2015.
International Search Report and Written Opinion issued in connection with related PCT Application No. PCT/US2014/066948 dated Mar. 9, 2015.
International Search Report and Written Opinion issued in connection with related PCT Application No. PCT/US2014/066942 dated Mar. 20, 2015.

\* cited by examiner

POWERLINE LUMINAIRE COMMUNICATIONS

CROSS REFERENCE TO RELATED APPLICATIONS

This application is a non-provisional of and claims the benefit of U.S. Provisional Patent Application Ser. Nos. 61/907,069, 61/907,078, 61/907,090, 61/907,114, 61/907,133, 61/907,150, 61/907,168, 61/907,188 and 61/907,210 filed on Nov. 21, 2013, the entire contents of which are incorporated herein by reference.

BACKGROUND

The invention relates generally to outdoor lighting systems that provide lighting for roadways, parking lots, building exteriors, and other outdoor areas using fixtures mounted on poles or other structures. The lighting fixtures are wired to a source of alternating current (AC) line power and include drivers or ballasts providing power to lamps, light emitting diodes (LEDs) or other light sources. Improved energy efficiency is desired for outdoor lighting systems, and hence improved lighting fixtures and accessories are desired to provide communications capabilities by which outdoor lighting fixtures can be intelligently used to provide lighting without consuming excessive energy.

Wireless, non-optical radio frequency (RF) communications have been suggested for many industrial applications including street lighting. Mesh communications have enjoyed extensive advocacy. Message routing protocols that select from a plurality of possibilities for message routing can take advantage of having more than one node in communication with any other particular node within the mesh. This topology appears to offer redundancy and graceful degradation under node failures. Wireless non-optical RF communication links are, however, vulnerable to several problems including changing propagation environments due to construction, vehicle movements, and other time-varying communication path impairments. The wireless non-optical RF communication links are also susceptible to degradation due to changing electromagnetic noise characteristic and also potential malicious interference. Such changing environmental aspects may increase the latency of the communications transported on the mesh network, decrease its usable bandwidth, and concomitantly reduce its throughput. Additionally, operational problems with wireless non-optical RF mesh networks have been reported including maintenance and management complexities and difficulties, antenna design and successful operation under real-world conditions including implementation and maintenance issues, protocol problems and discovered deficiencies under scaling and unanticipated interference scenarios.

While a mesh communications architecture functions well in fulfilling some luminaire communications, there are segments of luminaire communications that may require protection against some of the occasional impairments experienced in a wireless mesh architecture. There is therefore a need for other communication and control network options for operating and monitoring assets within a street lighting network.

BRIEF DESCRIPTION

The present invention relates to the field of street lighting control communications.

In an embodiment, the outdoor lighting system comprises a plurality of street lighting fixtures having communications capabilities, a lighting control system configured to communicate with and control the street lighting fixtures, and at least one of the street lighting fixtures configured to communicate with at least one RF enabled meter.

An embodiment teaches the use of modified geometric harmonic modulation for signaling to remote street lighting fixtures over a powerline connected to both the lighting control system and the street lighting fixtures.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The present invention relates to outdoor lighting systems and methods in which RF and/or PLC-enabled outdoor lighting fixtures form one or more networks. A lighting control system within a larger general purpose network may use the networks for control and/or monitoring purposes. For example, the lighting control system may obtain data from one or more utility meters by communicating through the general purpose network and the lighting system network.

The disclosed embodiments may be advantageously employed to facilitate utility meter reading without requiring manual reading of residential or commercial/industrial meters or localized wireless readings obtained from vehicles traversing local streets. Instead, utilities and other meter data consumers may obtain meter information via lighting control systems that control and/or monitor outdoor lighting fixtures via RF mesh networks and/or PLC-based local networks. The lighting control system may obtain the meter data through communications with the general purpose network and the lighting system network. This usage of the outdoor lighting infrastructure as a conduit for utility meter information may thus save vast resources of utility companies in staffing manual meter reading operations and/or the expense of constructing and maintaining dedicated network infrastructures.

Figure 1:
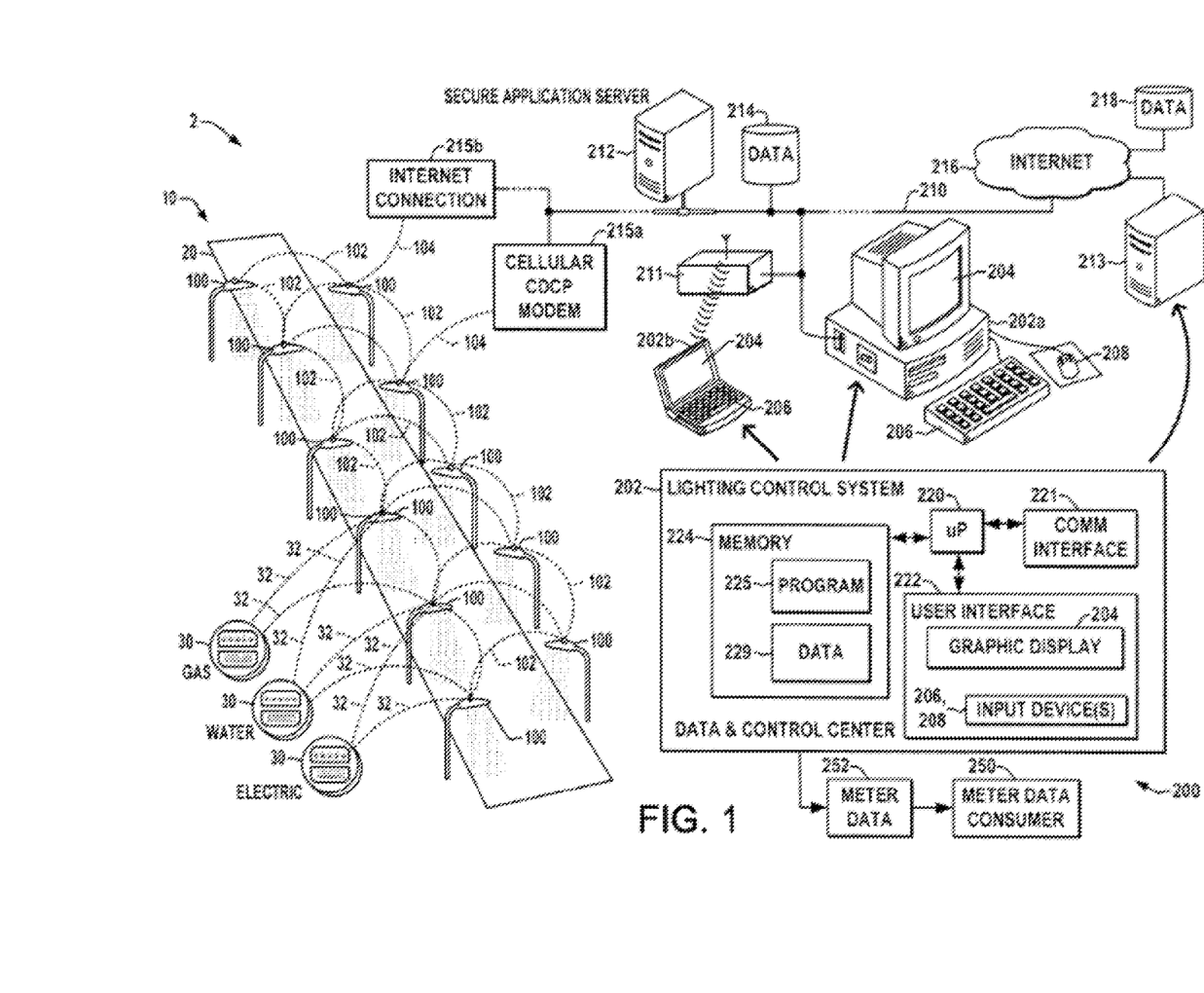
FIG. 1 is a system diagram illustrating an exemplary outdoor lighting system including RF-enabled outdoor fixtures forming a mesh network bridged with a lighting control system that obtains data from RF-enabled utility meters by communications through a general purpose network and the lighting system RF network.

FIG. 1 depicts an embodiment for an outdoor lighting system 2 with RF-enabled outdoor lighting fixtures 100 forming an RF mesh network 10 for communication between some or all fixtures 100 proximate a roadway or street 20. The mesh network 10 may be formed via one or more individual RF communications connections or links 102 between fixtures 100 that are within range of one another. The links 102 may be continuous or discontinuous, with the network 10 being an ad-hoc self-healing network. The fixtures 100 in certain embodiments are individually addressable and may have unique IDs, such that each fixture 100 is capable of identifying a messages intended for that fixture 100 and relaying received messages that are intended for other fixtures 100 to other fixtures within the network 10. In the foregoing manner, two fixtures 100 can communicate with one another through one or more intervening fixtures 100, even though they are not directly within RF range of each other.

Figure 2:
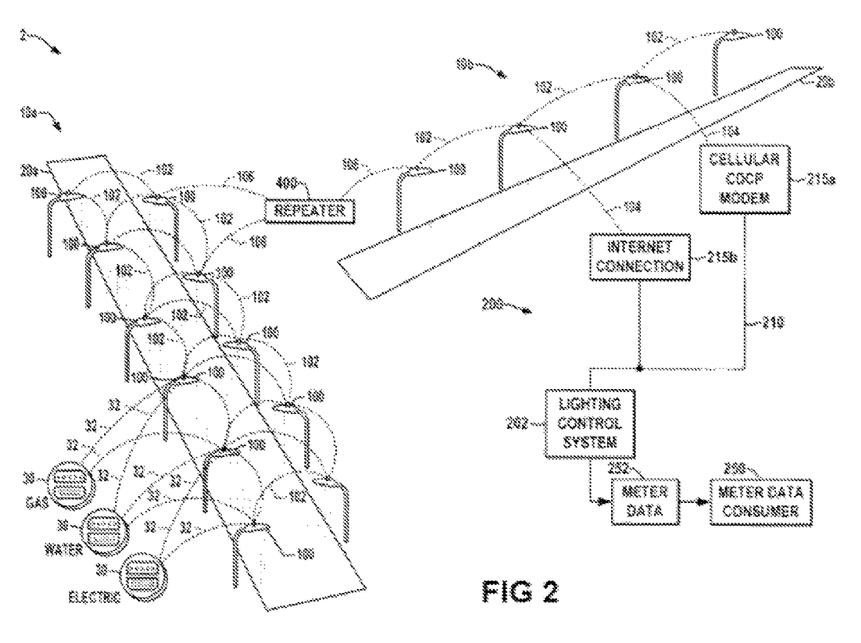
FIG. 2 is another system diagram showing an exemplary outdoor lighting system with multiple a mesh network portions interconnected by a repeater with one portion bridged to a general purpose network system.

FIG. 2 illustrates an embodiment for an RE-enabled outdoor lighting fixtures 100 that may establish RF mesh network connections 102 to form multiple mesh network portions around road surface 20a and 20b. Repeaters 400 may then bridge the mesh network portions into a larger mesh network 10. For example, FIG. 2 shows a first RF mesh network 10a and a second RF mesh network 10b, with repeater 400 interfacing between the networks 10a, 10b to provide communications resulting in a larger mesh RF mesh network 10. Moreover, one or more of the RF-enabled outdoor lighting fixtures 100 may be operative to communicate by RF signaling with at least one RF-enabled utility meter 30. The RF-enabled utility meter 30 may be an RF-enabled gas meter, a water meter, an electric power meter 30, alone or in combination for example. It is envisioned that any RF-enabled meter 30 may operate in place or alongside with the foregoing meters.

The RF mesh network 10 may be bridged with a lighting control system 202 of a general purpose network system 200 using any suitable bridging apparatus. In the embodiments shown in FIGS. 1 and 2, a bridging component 215 provides communications interfacing between the RF mesh network 10 and a general purpose network 210 of a network system 200. In certain embodiments, the bridging component may be a modem, such as a pole-mounted Central Data Collection Point (CDCP) modem 215a communicatively coupled to one of the fixtures 100 of the RF mesh network 10 to enable communications between the RF mesh network 10 and the general purpose network 210. In other embodiments, a pole-mounted Internet connection bridging component 215b provides an Internet connection to one of the RF-enabled outdoor lighting fixtures 100 of the RF mesh network 10 and interfaces communications between the networks 10 and 210.

The control system 202 may be operative to obtain meter data 252 from one or more RF-enabled utility meters 30 by communications through the general purpose network 210 and the lighting system RF network 10. The control system 202 can then provide the meter data 252 to one or more meter data consumers 250, such as utility companies, municipalities, companies, etc. In operation, the lighting control system 202 is operatively coupled with the general purpose network 210 by any suitable network interconnections, direct and/or indirect, including wired and/or wireless interconnections for transferring signaling and/or messaging. The system 202 further operates to control or monitor at least one of the RF-enabled outdoor lighting fixtures 100, in addition to obtaining data from the RF-enabled utility meter(s) 30 via communications through the general purpose network 210, the bridging component 215, and the RF mesh network 10.

In certain embodiments, the RF mesh network 10 may use a ZigBee wireless communications protocol, although other suitable communications protocols may also be used. Moreover, the fixtures 100 may operate using a number of different communications protocols. For example, a first communications protocol (e.g., ZigBee) may be used to communicate with other fixtures 100 in the mesh network 10, and a second communications protocol may be used to communicate with utility meters 30. In certain embodiments, the lighting control system 202 can instruct one or more of the lighting fixtures 100 to switch to a second protocol for contacting one or more meters 30 to obtain readings or other data therefrom. Once the lighting control system 202 has obtained the desired meter data, the fixture 100 will revert to the first protocol to relay the obtained meter data 252 back to the controller 202 via the RF mesh network 10, any intervening router(s) 400, the bridging component 215, and the general purpose network 210.

The wireless interface of the individual fixtures 100 may act as a router and retransmit received messages that are not destined for that particular fixture 100, thereby facilitating establishment and operation of the mesh network 10. For example, in an embodiment wherein at least one of the individual fixtures has ballast control units, a message destined for a ballast control unit of a specific fixture, the message may be relayed to the ballast control unit of that fixture and the command therein is used to control the dimmable ballasts and/or the light outputs. Other devices may be coupled with the mesh network 10 beyond the illustrated outdoor lighting fixtures 100, meters 30, repeaters 400, and bridging components 215. For example, external RF-enabled occupancy/motion sensors, external RF transmitters and/or receivers, and other like devices. For example, the mesh network 10 in certain embodiments may include a coordinator unit, such as a single coordinator per mesh network 10 (e.g., 1 for network portion 10a and another for portion 10b in FIG. 2). Upon initiating any network device, the fixture 100 registers with the coordinator unit using a unique identification. In the case of the outdoor fixtures 100, registration may include messages notifying the coordinator unit of the capabilities of the fixture, for example, how many dimmable driver/ballasts 116 and light sources 114 and other fixture parameters, such as current dimming programs, profiles, or their control parameters, and/or diagnostic information.

The coordinator may coordinate the fixtures 100 with other network devices and with one another. For example, the coordinator may send messages to the fixture 100 containing commands operative to control dimmable ballasts and the light outputs thereof. The coordinator unit may act based upon internal stimuli, such as an internal clock or timer, or external stimuli, such as an event triggered by a network device or a user, or instance, based on commands received from the lighting control system 202. For example, a coordinator unit may instruct the fixture 100 to power on light outputs at a certain time or to power on light outputs in response to motion sensed by a motion sensor device. The coordinator may be a dedicated network device or can be integrated with another network device having additional functions. For example, a light fixture 100 or a bridging device 215, or a motion sensor may act as the coordinator unit in addition to its above described functionality. Additionally, not every network device within the mesh network 10 need necessarily act as a router.

As shown in FIG. 1, the general purpose network system 200 may be any single or multiple network architecture that provides a processing environment in which one or more aspects of the present disclosure may be practiced. The system 200 may include one or more processor-based lighting control systems 202 implemented in a networked computing environment. In the example of FIG. 1, a desktop computer 202a and/or a portable computer 202b are operatively coupled with a network 210. Each of the desktop computer 202a and/or the portable computer 202b may include a graphical display 204 and one or more input devices, such as a keyboard 206, a mouse or other pointing device 208, microphones for speech commands, or other user input devices (not shown). The portable computer 202b may be coupled with the network 210 via a wireless transceiver 211. The network 210, in turn, may be operatively connected with other networks either singularly or in combination. Networks may include, but are not limited to, the internet 216 providing operative access between the computers 202 and one or more network servers 212, a network database 214, an internet data store 218 and a further server 213. In this regard, one or more of the database 214 and data store 218, servers 212, 213 and/or computers 202 may provide storage for meter data 252. The meter data 252 may be desired by a meter data consumer 250 to provide a unitary or distributed secure database. The storage may also be used for lighting control data or other information related to outdoor lighting systems being operated and monitored by the lighting control system 202.

Still referring to FIG. 1, the processor-based lighting control system 202 may be implemented in whole or in part in a network server 212, in one or both of the computers 202, and/or in combination thereof. The control system 202 may include a microprocessor or other computational element 220, a communication interface 221 that operatively interconnects control system 202 with the network 210, as well a memory 224, a graphical user interface 222 providing a graphic display 204 and one or more input devices such as the illustrated computer keyboard and/or mouse 206, 208. The memory 224 in this example may include data 229 and computer readable program code 225 with instructions executable by the processor 220 to implement the functionality described herein. The system 202 may operate on a unitary data set, and/or the data may be implemented in distributed storage fashion with storage of portions in the processor-based system 202, the network server 212, and/or in one or more internet based data stores 213, 214, 218.

The system 202 is communicatively interconnected (e.g., via the network 210) with one or more bridging components 215. Bridging components may be selected from a wide variety of components, such as a wireless network via a Cellular Digital Packet Data (CDPD) based modem, another wireless interface 215a, or an internet connection 215b that can provide data exchange and other communications between one or more devices within the mesh network system 10. An example, although not limited to, of devices within the mesh network system 10 that may be in a communicative relationship are light fixtures 100, meters 30 such that the processor-based lighting control system 202 receives data from and/or provides data to the devices 140, 100, 30. The processing element 220 in these embodiments may execute a program to enable the data and control center system to gather meter data 252. Gathering of meter data may occur from one or more of the meters 30 that are communicatively coupled (continuously or intermittently) with the mesh network 10. In an embodiment, a given meter 30 may be read using an RF connection with at least one of the RF-enabled lighting fixtures 100 of the mesh network 10 as shown in FIG. 1. Another embodiment could read meter 30 using a powerline connection 604 (PLC-based) to a powerline serving one or more PLC-enabled fixtures 100 of an outdoor lighting network.

Figure 3:
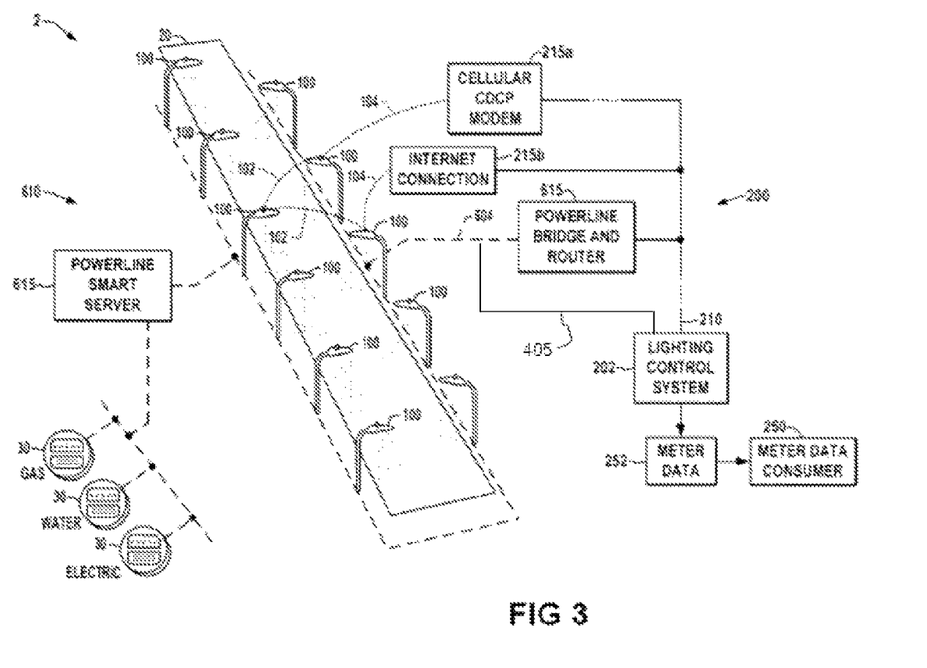
FIG. 3 is a system diagram illustrating an exemplary outdoor lighting system including Power Line Carrier (PLC)-enabled outdoor lighting fixtures forming a Lighting system network that is bridged with a lighting control system of a general purpose network system, where the control system obtains data from RF-enabled utility meters by communications through a general purpose network and the lighting system network.

FIG. 3 is an illustration of an embodiment for an outdoor lighting system 2 that may include Power Line Communication (PLC)-enabled outdoor lighting fixtures 100 forming a Lighting system network 610 that is bridged with the lighting control system 202 of the general purpose network system 200. In this embodiment, the lighting control system 202 may obtain data from PLC-enabled utility meters 30 by communications through the general purpose network 210 and the lighting system network 610. The PLC-enabled outdoor lighting fixtures 100 may be operative to communicate by power line signaling with a PLC-enabled utility meter 30 via the PLC outdoor lighting network 610, with one or more bridging components 215 and/or a powerline bridge and router 615 providing communications interfacing between the lighting network 610 and the general purpose network 210. The lighting control system 202 may operate as described above to control or monitor one or more of the PLC-enabled fixtures 100 and may also obtain meter data 252 from the PLC-enabled utility meter(s) 30 by communications through the general purpose network 210, the bridging component 215, 615, and the PLC outdoor lighting network 610. The outdoor lighting network 610 in certain embodiments includes at least one RF communications connections 102 between at least two of the outdoor lighting fixtures 100 as described above, and the RF-based and PLC-based operations can be used separately or in combination in various embodiments.

In certain embodiments, a modem bridging component 215a is coupled with one or more PLC-enabled outdoor lighting fixture 100 to provide communications interfacing between the lighting network 610 and the general purpose network 210. In certain embodiments, an Internet bridging component 215b provides an Internet connection to the PLC-enabled fixture 100 to interface communications between the PLC network 610 and the general purpose network 210. In certain embodiments, the bridging component is a powerline bridge and router 615 that provides communications interfacing between the PLC outdoor lighting network 610 and the general purpose network 210. Multiple bridging components can be used in the various implementations, along with repeaters 400 (e.g., FIG. 2 above) to connect segments of a PLC/RF network 610, 10. Moreover, the PLC-enabled devices 100, 615, etc. may provide multiple protocol support, for instance, with one protocol used for communicating with fixtures 100 and another used for communicating with utility meters 30. Moreover, the above described occupancy sensor functionality and usage can be employed via one or more occupancy or motion sensors (e.g., RF, directly connected, and/or PLC-enabled) which are operatively coupled with one of the PLC-enabled outdoor lighting fixtures 100. The lighting fixture 100, moreover, is operative to notify another fixture 100 of a sensed occupancy or motion signal or message received from a sensor via the PLC outdoor lighting network 610.

The powerline supplying luminaires in many street lighting applications makes use of underground power distribution wire runs. These underground wire runs are good candidates for carrying PLC signals for controlling the luminaires and devices associated with the luminaires.

These underground wire runs are dedicated or primarily dedicated to powering the luminaires and are not subject to many of the disruptive events that take place above ground such as physical mishaps involving structures, some severe weather events, etc. This offers an opportunity to make a cost-efficient double use of the already installed wiring by sending and/or receiving communications from one or more access points on the power line to individual luminaires or groupings of luminaires. PLC technology is capable of providing communications on power distribution networks that have known and slowly changing topologies such as those networks installed for street lighting. In such networks the communications engineer knows the locations of the individual luminaires and extensions to and deletions of parts of the wiring are anticipated and known. The power line segments in a street lighting network are also relatively simple and this enables communication protocols to be developed that will scale with the street lighting network's span.

The useful communications bandwidth of a power line is a function of many parameters including noise. According to the IEEE Standard 1901 for Broadband over Power Line Networks, Annex F, power line channels are subject to four classes of noise. They include thermal background noise that is Gaussian and colored, periodic and aperiodic impulsive noise, AM narrowband noise, and noise from other users of the power line communications medium. For a power line dedicated to providing street lights with power, it is expected that the latter two classes of noise will be minimal. Other factors influencing the communications useful bandwidth of the power line comprise the network topology, impedance mismatches, grounding practices, and other physical characteristics that may induces reflections and phase changes and frequency selective attenuation. There may also be interference generated by ageing or inchoate faults within the underground wiring system.

In considering and planning a powerline communications system using the underground wire runs, three aspects of underground power distribution to a street lighting system may be considered. First, lengthy underground wire runs may exhibit capacitance that increases attenuation at higher frequencies for signals being conducted on the powerline, thereby reducing the signal-to-noise ratios at these higher frequencies.

Second, lengthy underground wire runs may host standing electromagnetic waves. These waves may also increase the apparent attenuation of power line conducted signals at frequencies corresponding to the standing wave frequencies.

Third, the powerline communication signals may have to transfer across transformers. This is due in part to meeting the need for significant regulation of the power supplied to a traditional street lighting network, an imperative for at least two reasons. First, the current supplied to a lamp should be at its rated value in order for the lamp to radiate its light at full brilliancy. Second, over-currents forced through a lamps, even a percent more than the lamps ratings, may reduce the life of the lamp life by a significant percentage, sometimes as high as 25%. In order to achieve the required tight regulation of the power supplied to the lighting network, the lighting designers may employ constant current transformers. These transformers typically use a moving coil to provide constant current.

Additionally, powerline communication signals can become altered as they pass across transformers. This results from the transformer introducing non-linear phase shifts in the broadband signal passing across the transformer via inductive coupling.

A suitable powerline communications system may be based on modified Geometric Harmonic Modulation (GHM) as taught in U.S. Pat. No. 5,844,949 and U.S. Pat. No. 6,424,250 both of which are incorporated by reference. GHM is classified as a spread spectrum modulation as the information transmitted is spread over a much wider bandwidth than required by the information bandwidth and it forms the physical layer (PHY) of the luminaire lighting network. Other modulation techniques, such as OFDM, are envisioned for this application. OFDM signals exhibit a large peak-to-average power ratio or high crest factor that requires the OFDM transmitter to have a higher resolution digital-to-analog converter (DAC) than the corresponding DAC used in the GHM transmitter. The same is true respecting the receivers in the OFDM and GHM receivers. Converters requiring higher resolution tend to increase the components costs. Accordingly, while other modulation techniques are envisioned, GHM is discussed in the embodiments described herein.

Geometric Harmonic Modulation (GHM) is used in communications systems for radio wave communications and have been described in U.S. Pat. No. 5,519,725 issued May 21, 1996, "Geometric Harmonic Modulation (GHM) for Combined Analog/Digital Transmissions." GHM allocates signaling energy into lobes, or tones, at different frequencies being evenly spaced at geometrically increasing multiples of a base frequency. The GHM signaling waveforms are true spread spectrum signals in that the signal bandwidth, the bandwidth from the lowest frequency tone to the highest, vastly exceeds the information bandwidth conveyed by the GHM transmission.

U.S. Pat. No. 5,844,949 issued Dec. 1, 1998, teaches that by suitably modifying the GHM signaling waveform, the waveform will exhibit spectral properties well suited to significantly avoiding the synchronous noise environment encountered on much of the power line network. This was done through taking a more general look at GHM and the power line noise. It was determined that lobes of the modulated GHM signal should be positioned on a frequency spectrum interleaved with the power line noise. Since power line noise may have a great deal of interference at the basic oscillation frequency, 60 Hz in the United States, and at overtones, multiples of the basis frequency, the signal should not reside in these frequency regions. By modulating the signal to place the majority of its spectral energy between the interference lobes, the signal may be used for a particular power line communication application depending on considerations of information capacity, multiplicity of users, line coupling response, and communication channel characteristics. By selecting frequencies correctly, as taught in U.S. Pat. No. 5,844,949 issued Dec. 1, 1998, the signal structure may be interleaved with harmonic power line noise and this implementation is referenced as modified Geometric Harmonic Modulation.

In another embodiment the modified Geometric Harmonic Modulation signal may be subject to pre-emphasis before placing it onto the powerline. The pre-emphasis includes a pre-emphasis amplifier applying a frequency-dependent amplitude mask to the modified Geometric Harmonic Modulation signal in order to adjust the signal spectrum so that it will be received at a selected point with more nearly equal energy in each of the received signal lobes. This technique is effective in counteracting the effects of severe frequency dependent fading encountered in the signal's transmission.

Modified GHM forms the PHY layer for PLC communications. The Media Access Control (MAC) layer may comprise such functions as error detection, error correction, encryption, and authentication, and repeat request. Higher levels of the communication protocol may comprise functions such as collision detection, collision avoidance, carrier sense multiple access, and time division multiple access transmit controls.

Figure 4A:
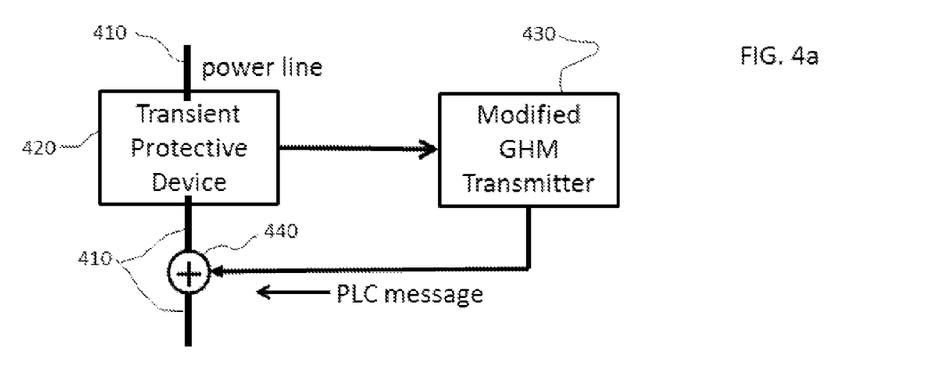
FIG. 4a illustrates a modified GHM transmitter coupled to a powerline according to one embodiment.

As shown in FIG. 3, the lighting control system 202 may be electrically connected, via a connecting powerline 405, to power connection 604 of the powerline serving the street lighting fixtures 100. The lighting control system 202 may be electrically connected in the fashion illustrated in FIGS. 4a and 4b. FIG. 4a illustrates the modified GHM transmitter 430 coupled to the powerline by a transient protective device 420 which limits power surges. Limiting power surges protects equipment downline, and passes the powerline waveform to the modified GHM transmitter 430. The GHM transmitter 430 determines master timing information from the fundamental power line frequency. The powerline conducted (PLC) message generated by the modified GHM transmitter 430 is coupled onto the powerline 410 by a summer 440.

Figure 4B:
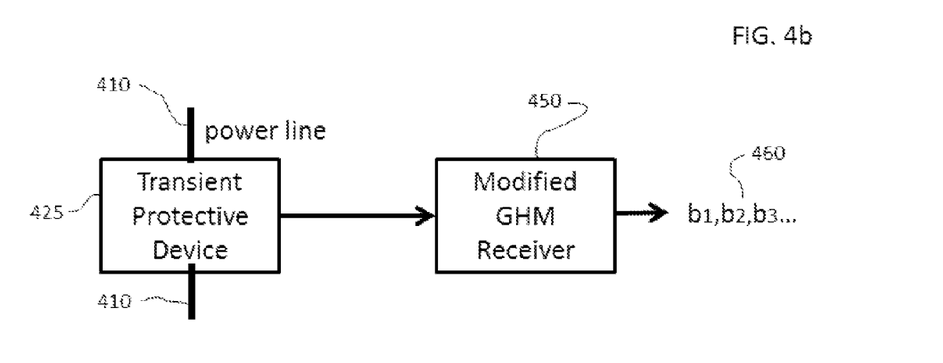
FIG. 4b illustrates a modified GHM receiver coupled to a powerline according to one embodiment.

FIG. 4b illustrates the modified GHM receiver 450 coupled to the powerline by a transient protective device 425 which limits power surges, protecting equipment downline, and passes the powerline waveform to the modified GHM receiver 450 which recovers the PLC message information 460.

Some embodiments involve the use of one or more electronic or computing devices. Such devices typically include a processor or controller, such as, without limitation, a general purpose central processing unit (CPU), a graphics processing unit (GPU), a microcontroller, a field programmable gate array (FPGA), a reduced instruction set computer (RISC) processor, an application specific integrated circuit (ASIC), a programmable logic circuit (PLC), and/or any other circuit or processor capable of executing the functions described herein. The methods described herein may be encoded as executable instructions embodied in a computer readable medium, including, without limitation, a storage device, and/or a memory device. Such instructions, when executed by a processor, cause the processor to perform at least a portion of the methods described herein. The above examples are exemplary only, and thus are not intended to limit in any way the definition and/or meaning of the term processor.

Exemplary embodiments for enhancing the build parameters for making additive manufactured components are described above in detail. The apparatus, systems, and methods are not limited to the specific embodiments described herein, but rather, operations of the methods and components of the systems may be utilized independently and separately from other operations or components described herein. For example, the systems, methods, and apparatus described herein may have other industrial or consumer applications and are not limited to practice with electronic components as described herein. Rather, one or more embodiments may be implemented and utilized in connection with other industries.

Although specific features of various embodiments of the invention may be shown in some drawings and not in others, this is for convenience only. In accordance with the principles of the invention, any feature of a drawing may be referenced or claimed in combination with any feature of any other drawing.

An exemplary technical effect of the methods and systems described herein includes: (a) generating a melt pool based on the build parameters of the component; (b) detecting an optical signal generated by the melt pool to measure the size or the temperature of the melt pool; and (c) modifying the build parameters in real-time based on the size or the temperature of the melt pool to achieve a desired physical property of the component.

Some embodiments involve the use of one or more electronic or computing devices. Such devices typically include a processor or controller, such as, without limitation, a general purpose central processing unit (CPU), a graphics processing unit (GPU), a microcontroller, a field programmable gate array (FPGA), a reduced instruction set computer (RISC) processor, an application specific integrated circuit (ASIC), a programmable logic circuit (PLC), and/or any other circuit or processor capable of executing the functions described herein.

The methods described herein may be encoded as executable instructions embodied in a computer readable medium, including, without limitation, a storage device, and/or a memory device. Such instructions, when executed by a processor, cause the processor to perform at least a portion of the methods described herein. The above examples are exemplary only, and thus are not intended to limit in any way the definition and/or meaning of the term processor.

Exemplary embodiments for enhancing the build parameters for making additive manufactured components are described above in detail. The apparatus, systems, and methods are not limited to the specific embodiments described herein, but rather, operations of the methods and components of the systems may be utilized independently and separately from other operations or components described herein. For example, the systems, methods, and apparatus described herein may have other industrial or consumer applications and are not limited to practice with electronic components as described herein. Rather, one or more embodiments may be implemented and utilized in connection with other industries.

Although specific features of various embodiments of the invention may be shown in some drawings and not in others, this is for convenience only. In accordance with the principles of the invention, any feature of a drawing may be referenced or claimed in combination with any feature of any other drawing.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:
1. An outdoor lighting system comprising:
   a plurality of street lighting fixtures configured to communicate using at least one communications protocol;
   a lighting control system configured to communicate with and control the plurality of street lighting fixtures using at least a first communications protocol; and
   at least one of the plurality of street lighting fixtures configured to communicate using a second communications protocol that is different from the first communications protocol; and at least one powerline communication (PLC)-enabled meter configured to communicate with the at least one of the street lighting fixtures using the second communications protocol, wherein the first communications protocol comprises a signal structure interleaved with a harmonic of a noise of a powerline and the lighting control system comprises a modified Geometric Harmonic Modulation (GHM) transmitter.

2. The outdoor lighting system of claim 1 wherein the modified GHM transmitter is communicatively connected to the powerline and the powerline is electrically connected to the at least one of the plurality of street lighting fixtures wherein the at least one of the plurality of street lighting fixtures includes a modified GHM receiver communicatively connected to the powerline.

3. The outdoor lighting system of claim 2 wherein the modified GHM transmitter comprises a pre-emphasis amplifier.

4. The outdoor lighting system of claim 3 wherein the modified GHM transmitter is communicatively connected to the powerline through a transient protection device.

5. The outdoor lighting system of claim 4 wherein the modified GHM receiver is communicatively connected to the powerline through a transient protection device.

6. The outdoor lighting system of claim 1 wherein the at least one of the plurality of street lighting fixtures comprises a modified GHM transmitter communicatively connected to the powerline.

7. The outdoor lighting system of claim 6 wherein the at least one of the plurality of street lighting fixtures comprises the modified GHM transmitters communicatively connected to the powerline through a transient protection device.

8. The outdoor lighting system of claim 1 wherein the at least one meter communicates with the at least one of the plurality of street lighting fixtures using a radio frequency (RF) as the second communications protocol.

9. The outdoor lighting system of claim 8 wherein the lighting control system further comprises a communications control that signals the at least one of the plurality of street lighting fixtures to switch communications mode between the first communications protocol and the second communications protocol.

10. A method for operating an outdoor lighting system comprising the steps:

controlling a plurality of street lighting fixtures by a lighting control system through communications sent over a powerline common to the plurality of street lighting fixtures;

including a plurality of control signals in the communications, wherein a structure of each of the plurality of control signals is interleaved with a harmonic of a noise of the powerline;

transmitting the control signals to at least one of the plurality of street lighting fixtures using a modified Geometric Harmonic Modulation (GHM) transmitter operatively connected to the powerline;

receiving control signals by the at least the one of the plurality of street lighting fixtures using a modified GHM receiver communicatively connected to the powerline;

reading, by the at least one of the plurality of street lighting fixtures, data for at least one powerline communication (PLC)-enabled meter; and relaying data read from the PLC-enabled meter back to the outdoor lighting control system.

11. The method of claim 10 wherein transmitting further comprises applying pre-emphasis to control signals transmitted by the modified GHM transmitter.

12. The method of claim 11 wherein transmitting further comprises the modified GHM transmitter transmitting signals according to a first communications protocol.

13. The method of claim 12 wherein transmitting further comprises transmitting as the first communications protocol at least one of the features from the group comprising error detection, error correction, encryption, authentication, and repeat request.

14. The method of claim 13 wherein transmitting further comprises the at least one of the plurality of street lighting fixtures preparing messages and transmitting messages using Geometric Harmonic Modulation over the powerline to another modified GHM receiver within the outdoor lighting system control system.

15. The method of claim 14 wherein the Geometric Harmonic Modulation (GHM) is selected from the group comprising collision detection, collision avoidance, and time division multiple access.

16. The method of claim 14 wherein the prepared messages are in response to one or more lighting system control messages.

17. The method of claim 14 wherein the prepared messages are created sua sponte by the one or more street lighting fixtures.

18. The method of claim 14 wherein the prepared messages do not originate from the outdoor lighting system control system and further comprising relaying the prepared messages by the one or more street lighting fixtures.

19. The method of claim 10 further comprising the outdoor lighting control system controlling the at least one light fixture to switch between the first communications protocol and a second communications protocol that is an RF based protocol.

* * * * *